US006392443B1

(12) United States Patent
Gauthier

(10) Patent No.: US 6,392,443 B1
(45) Date of Patent: *May 21, 2002

(54) POWER/AREA EFFICIENT METHOD FOR HIGH-FREQUENCY PRE-EMPHASIS FOR CHIP TO CHIP SIGNALING

(75) Inventor: Claude R. Gauthier, Fremont, CA (US)

(73) Assignee: Sun Microsystems, Inc., Palo Alto, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/504,508

(22) Filed: Feb. 15, 2000

(51) Int. Cl.[7] .......................... H03K 19/94; G06G 7/16
(52) U.S. Cl. ...................... 326/86; 326/112; 327/359
(58) Field of Search .......................... 326/86, 82, 93, 326/95, 98, 112; 327/359

(56) References Cited

U.S. PATENT DOCUMENTS

| 4,637,036 A | | 1/1987 | Kobari ........................ 375/76 |
| 4,791,590 A | | 12/1988 | Ku et al. |
| 5,300,820 A | | 4/1994 | Sayama et al. ............. 307/234 |
| 5,396,109 A | | 3/1995 | Oshiba ........................ 327/233 |
| 5,578,943 A | | 11/1996 | Sasaki |
| 5,578,944 A | | 11/1996 | Sasaki |
| 5,787,261 A | | 7/1998 | Osaka et al. |
| 5,887,150 A | * | 3/1999 | Schneider et al. .......... 710/126 |
| 5,923,201 A | | 7/1999 | Suzuki ........................ 327/291 |
| 5,926,041 A | * | 7/1999 | Duffy et al. ................. 327/12 |
| 6,163,173 A | * | 12/2000 | Storino et al. .............. 326/98 |

OTHER PUBLICATIONS

Lecture Slides from "Digital Systems Engineering" by W. Dally; Oct. 21, 1998, 10 Pages.
W. Dally and J. Poulton, "Transmitter Equalization for 4Gb/s Signalling", undated, 10 pages.
J. Poulton, W. Dally and S. Tell, "A Tracking Clock Recovery Receiver for 4Gb/s Signaling", undated, 13 pages.
W. Dally, M–J. Lee, F–T. An, J. Poulton, and S. Tell, "High Performance Electrical Signaling", MPPOI98, 1998, 6 pages.
W. Dally, J. Poulton, and S. Tell, slides from presentation: "Multi–gigabit signaling with CMOS", May 12, 1997, 26 pages.
W. Dally, M–J. Lee, F–T. An, J. Poulton, slides from presentation: "A Small Low–Power High–Speed Link", IEEE/LEOS Ninth Workshop on Interconnections within High–Speed Digital Systems, May 18, 1998, 30 pages.

* cited by examiner

Primary Examiner—Michael Tokar
Assistant Examiner—James H. Cho
(74) Attorney, Agent, or Firm—Rosenthal & Osha L.L.P.

(57) ABSTRACT

A method which allows for a more efficient pre-emphasis of a high frequency inter-chip signal. The method uses a single predriver stage to equalize a signal when a transition in value of a digital signal is detected. The method equalizes the signal with decreased power and area requirements for greater efficiency.

6 Claims, 4 Drawing Sheets

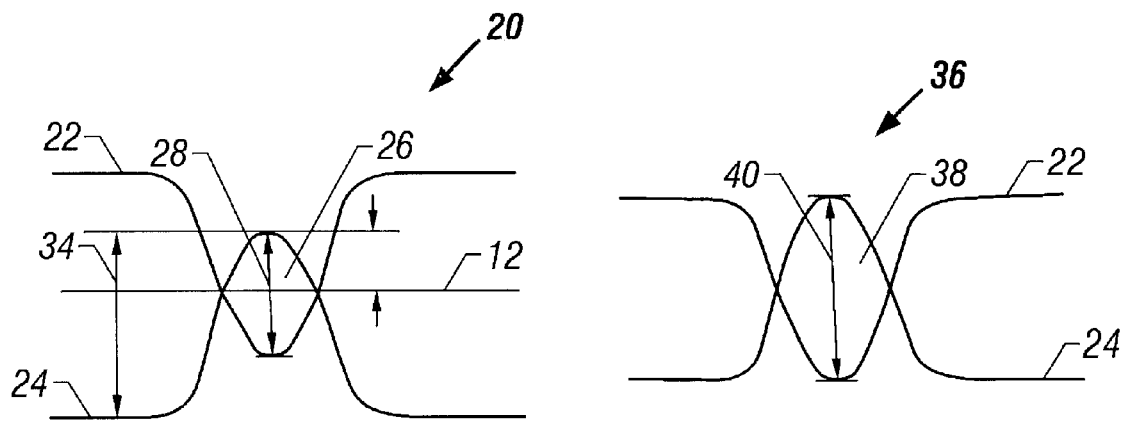
FIG. 3A  FIG. 3B
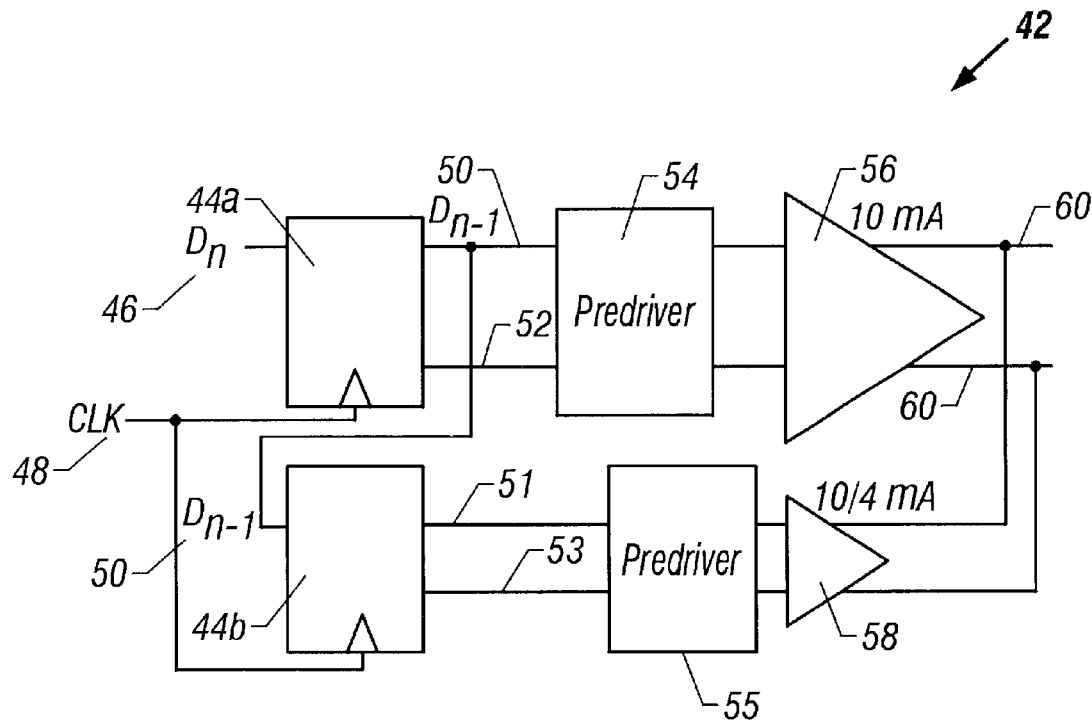
FIG. 4
(Prior Art)

POWER/AREA EFFICIENT METHOD FOR HIGH-FREQUENCY PRE-EMPHASIS FOR CHIP TO CHIP SIGNALING

FIELD OF INVENTION

The invention relates to digital signaling and more particularly to high frequency preemphasis of a digital signal.

BACKGROUND

In many digital systems, the interconnection bandwidth between chips is a critical limitation on performance. Historically, intra-chip signaling has performed much more slowly than on-chip processing. As technology continues to scale smaller, this bottleneck will become even more pronounced. Without improvements to high speed digital signaling techniques, interchip signaling will prove to be a limit to the technology.

An example of an ideal digital signal 10 is shown in FIG. 1a. A midpoint 12 is shown that serves to define the change in the value of the data bit. In the lower region 10, the data bit has a value of "0". While in the upper region 14, the data bit has a value of "1". This type of digital scheme with a mid-point 12 is referred to as a single-end signal design. FIG. 1b shows a more realistic view of the waveform of the same digital signal 18. The midpoint 12 as well as we the upper 14 and lower 16 regions are the same. However, the signals are subjected to some suppression of the signal's peak value called attenuation. The attenuation is particularly pronounced in the case of a single "1" in a field of "0"s. In some instances, the attenuated signal barely reaches the midpoint 12 which results in a very low probability of detection. The attenuation is primarily caused by skin-effect resistance and dielectric absorption by the transmission line. However, the skin-effect resistance is usually the dominant factor. In any case, the magnitude of the attenuation will increase with the frequency.

With a typical broadband signal, the superposition of an unattenuated low frequency signal component with attenuated high frequency signal components causes intersymbol interference that reduces the maximum frequency at which the system can operate. During this intersymbol interference, or hysteresis, the signal "remembers" its previous state. The problem is not so much the magnitude of the attenuation as it is the interference caused by the frequency dependent nature of the attenuation. The interference comes from noise sources such as receiver offset, receiver sensitivity, crosstalk, reflections of previous data bits, and coupled supply noise.

The effects of such interference are shown in FIGS. 2a and 2b. Both of these FIGS. show a differential digital signal design. The differential signal differs from the single end signal in that it provides complementary high and low signals instead of a single signal. FIG. 2a shows an attenuated differential signal 20. The high signal component 22 and the low signal component 24 intersect to form an eye 26. The amplitude of the eye 28 is obviously dependent on the amount of attenuation of each signal. Only a few decibels (dB) of frequency dependent attenuation can be tolerated by such a signaling system before intersymbol interference overwhelms the signal. FIG. 2b shows a differential signal with deterministic jitter 30. The amount of offset 32 of jitter affects the width of the eye and may possibly eliminate the eye entirely as shown in FIG. 2b. Jitter is caused by fluctuations in the sampling clock, fluctuations in the receiving clock, and delay variations in the signal path. Each of these sources of jitter are primarily the result of power supply modulation and crosstalk induced delay variation.

One solution to the problem of intersymbol interference is equalization of the signal by pre-emphasizing the high-frequency components of the signal before transmission. This will blue effectively eliminate the interference. The effects of equalization are shown in FIGS. 3a and 3b. FIG. 3a shows an unequalized signal that is similar to that shown in FIG. 2a. As shown previously, the amplitude 28 of the eye 26 of the signal is reduced due to the frequency dependent attenuation. FIG. 3b shows a signal 36 where both the high signal component 22 and the low signal component 24 have been equalized. As can be clearly seen, the amplitude 40 of the eye 38 is increased while the full width of the eye 38 is maintained.

Equalization is performed by having a main transmitter and an equalizing duplicate transmitter sum their output currents. The equalizing duplicate transmitter operates with a data bit that is delayed by one clock cycle. A prior art embodiment of a high frequency pre-emphasis circuit is shown in FIG. 4. An initial data bit 46 ($D_N$) is provided as an input to a standard "flip-flop" circuit 44a. The flip-flop will output the initial data bit ($D_N$) and its complement data bit ($D_N'$) upon receiving a clock pulse 48 whereupon a new initial data bit will be provided to the flip-flop 44a. Both outputs 50 and 52 are then input into a predriver 54. Upon receipt of the clock pulse 48, the output data bit 50 ($D_{N-1}$) is also input into another flip-flop circuit 44b. Because this bit is effectively delayed one clock cycle from being input into the second flip flop 44b, it is the previous data bit 50 ($D_{N-1}$) from the initial data bit 46 ($D_N$). As with the first flip-flop 44a, the second flip-flop 44b will output the previous data bit 50 ($D_{N-1}$) and the complement previous data bit 52 ($D_{N-1}'$) upon receiving a clock pulse 48 into a second predriver 55. The outputs of both flip-flops 44a and 44b are input into two separate predrivers 54 and 55 which each comprise a pass gate multiplexer and a clamping buffer. The output from the predriver 54 for the first flip-flop 44a is input into a 10 mnA output stage 56 while the output from the predriver 55 for the second flip-flop 44b is input into a 10/4 mA output stage 58. The outputs from both output stages 56 and 58 are then combined in the output lines 60.

SUMMARY OF INVENTION

In one embodiment, the invention is a method for pre-emphasizing a digital signal comprising: receiving a data bit as input for a first flip-flop circuit; outputting the data bit and the complement of the data bit from the first flip-flop circuit; receiving a previous data bit from the output of the first flip-flop circuit as input for a second flip-flop circuit; outputting the previous data bit and the complement of the previous data bit from the second flip-flop circuit; receiving the data bit, the complement of the data bit, the previous data bit, and the complement of the previous data bit as input for a predriver; pre-emphasizing a transition in value between the data bit and the previous data bit with the predriver; and outputting an equalized digital signal from the predriver.

The advantages of the disclosed invention may include the use of single drive stage for pre-emphasizing a high frequency signal. This allows for a reduction of power dissipation, a reduction in required area on the chip, and an increase in the bandwidth.

BRIEF DESCRIPTION OF DRAWINGS

FIG. 3a shows an alternative view of a non-equalized differential digital signal.

FIG. 3b shows a view of an equalized differential digital signal.

FIG. 4 shows a prior art implementation of a pre-emphasis circuit.

DETAILED DESCRIPTION

Figure 1A:
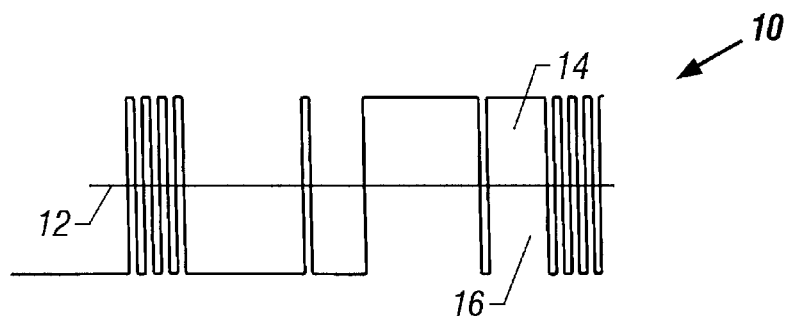
FIG. 1a shows an ideal digital signal.
Figure 1B:
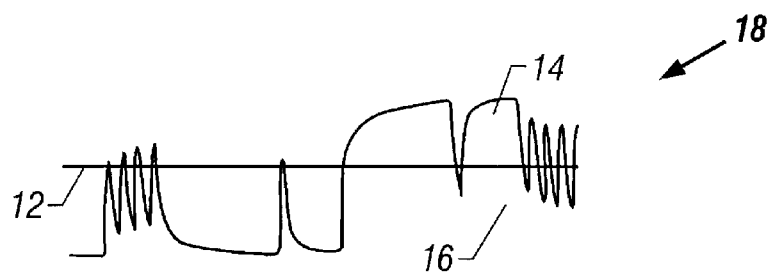
FIG. 1b shows a single-ended digital signal.
Figure 2A:
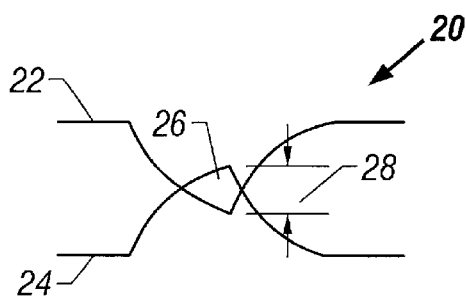
FIG. 2a shows a non-equalized differential digital signal.
Figure 2B:
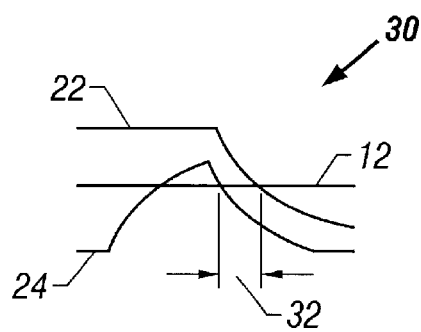
FIG. 2b shows a differential digital signal with a deterministic jitter.

Exemplary embodiments of the invention will be described with reference to the accompanying drawings. Like items in the drawings are shown with the same reference numbers.

Figure 5:
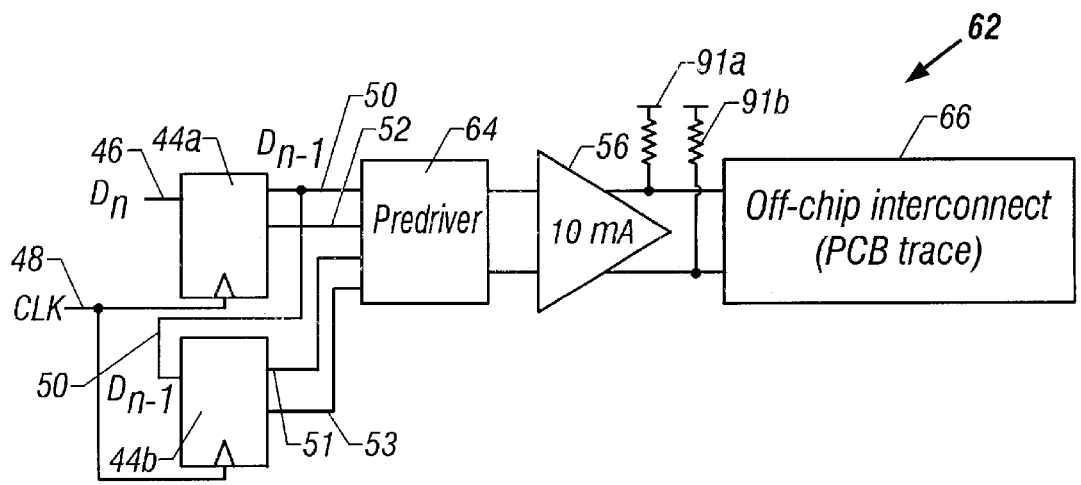
FIG. 5 shows an embodiment of an "N-channel" implementation of a pre-emphasis circuit.

FIG. 5 shows one embodiment of the present invention with a high frequency pre-emphasis circuit. An initial data bit 46 ($D_N$) is provided as an input to a standard flip-flop circuit 44a. The flip-flop 44a will output the initial data bit ($D_N$) and its complement data bit ($D_N$') upon receiving a clock pulse 48 whereupon the flip-flop 44a will receive a new data bit as input. The output data bit 50 ($D_{N-1}$) is also input into another flip-flop circuit 44b. Because this bit is effectively delayed one clock cycle from being input into the second flip flop 44b, it is the previous data bit 50 ($D_{N-1}$) from the initial data bit 46 ($D_N$). As with the first flip-flop 44a, the second flip-flop 44b will output the previous data bit 50 ($D_{N-1}$) and the complement previous data bit 52 ($D_{N-1}$') upon receiving a clock pulse 48.

The output bits 50, 51, 52 and 53 of both flip-flops 44a and 44b are then input into a single predriver 64 which pre-emphasizes the signal and sends the result to an output stage 56. This stage could be a 10 mA output stage or any other suitable type of output stage. After the output stage 56, the signal is passed on to an off-chip interconnection 66. This connection could be a printed circuit board (PCB) trace or another suitable connection.

Figure 6:
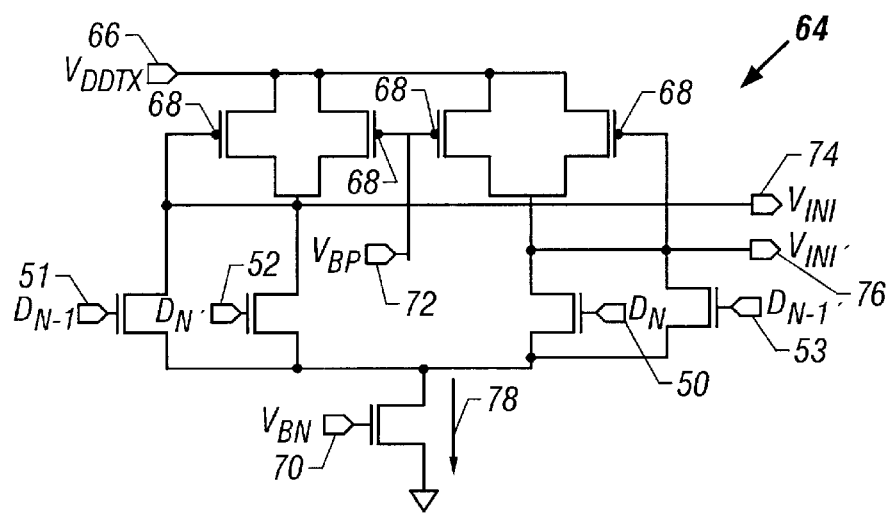
FIG. 6 shows a schematic of the predriver of an "N-channel" implementation of a pre-emphasis circuit.

A detailed schematic of the predriver 64 circuitry is shown in FIG. 6. The circuit is shown with two sets of two parallel "p-type" transistors 68, a transmitter supply voltage 66 ($V_{DDTX}$), an output voltage 74 ($V_{IN1}$) with its complement voltage 76 ($V_{IN1}$'), a p-channel bias voltage 72 ($V_{BP}$) provided to two "p-type" transistors, and an n-channel bias voltage 70 ($V_{BN}$) provided to an "n-type" transistor. The inputs for all of the data bits and their complements 50, 51, 52, and 53 are shown being provided to "n-type" transistors.

The transistor which receives the n-channel bias voltage 70 ($V_{BN}$), acts as a current source for the predriver circuit 64. Increasing the size of this transistor will increase the current and correspondingly increase the speed of the stage. The input data bits 50, 51, 52, and 53 are provided to "n-type" transistors that steer the current drawn by the current source according to there differential state. The input data bits 50, 51, 52, and 53 correspond to the digital representation of the present data bit and the previous data bit. The ratio of the sizes of the transistors will determine the degree of pre-emphasis. In one embodiment, the transistors that receive the present data bit 50 and 52 are 4× larger that the transistors that receive the previous data bit 51 and 53. The resulting outputs 74 and 76 are an analog representation of the input conditions with the pre-emphasis input. The "p-type" transistors 68 function as load transistors for the circuit. Each leg contains a diode connected device and a triode connected device. The sum of these components is fairly linear and is an accurate resistor representation.

The circuit forms a digital to analog (D/A) converter. If a bit swing pattern (1-0 or 0-1) is transmitted, this predriver 64 will steer more current to the output 78 thus pre-emphasizing the transition. If a swing pattern is not transmitted, the output 78 is lessened which attenuates the amplitude.

Figure 7:
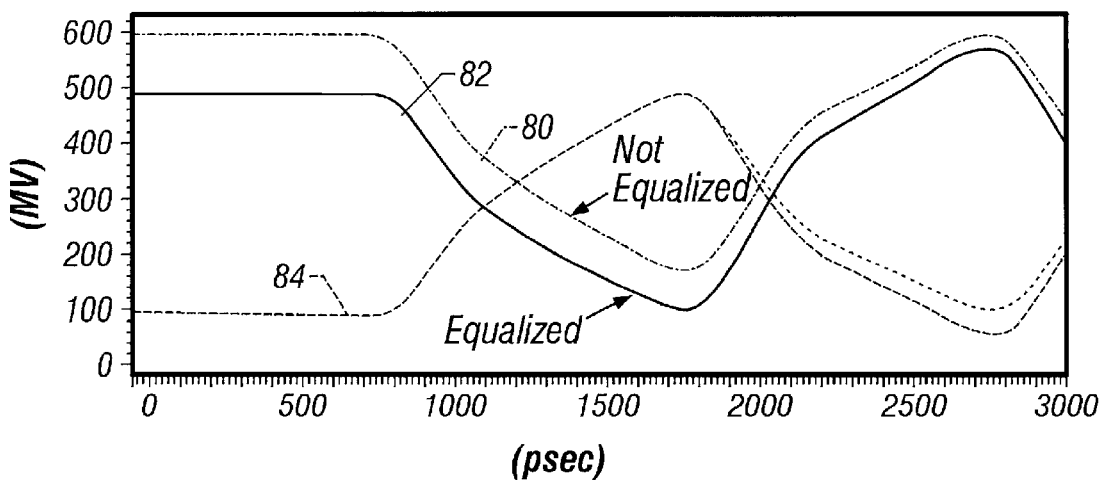
FIG. 7 shows a wave form output of the circuit shown in FIGS. 5 and 6.

FIG. 7 shows a waveform output of the circuit shown in FIGS. 5 and 6. The equalized signal 82 is shown superimposed over the non-equalized signal 80 for ease of comparison. In this embodiment, equalization has increased the eye amplitude to 390 mV from 318 mV. The width of the eye has increased to 965 psec from 815 psec.

The type of circuit shown in FIGS. 5 and 6 is known as an "n-channel" transmitter. As shown in FIG. 7, an n-channel transmitter equalizes the upper component 82 of the differential signal. An alternative embodiment uses a "p-channel" transmitter to equalize the lower component 84 of the differential signal. In this embodiment, the waveform of the lower component 84 is moved "up" in relation to the upper component 80 for a similar result as the n-channel transmitter.

Figure 8:
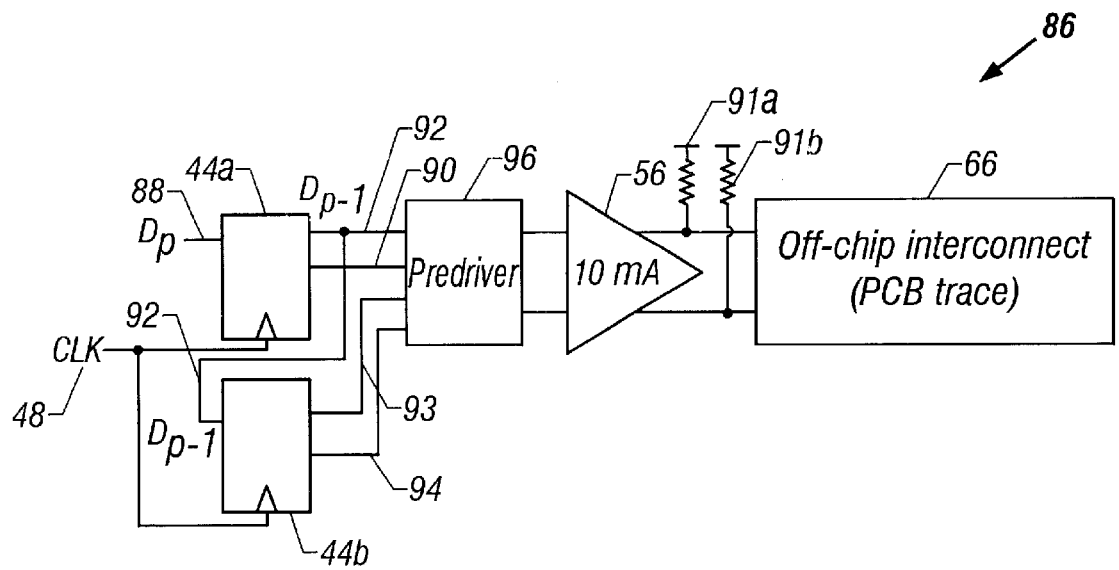
FIG. 8 shows an embodiment of a "P-channel" implementation of a pre-emphasis circuit.
Figure 9:
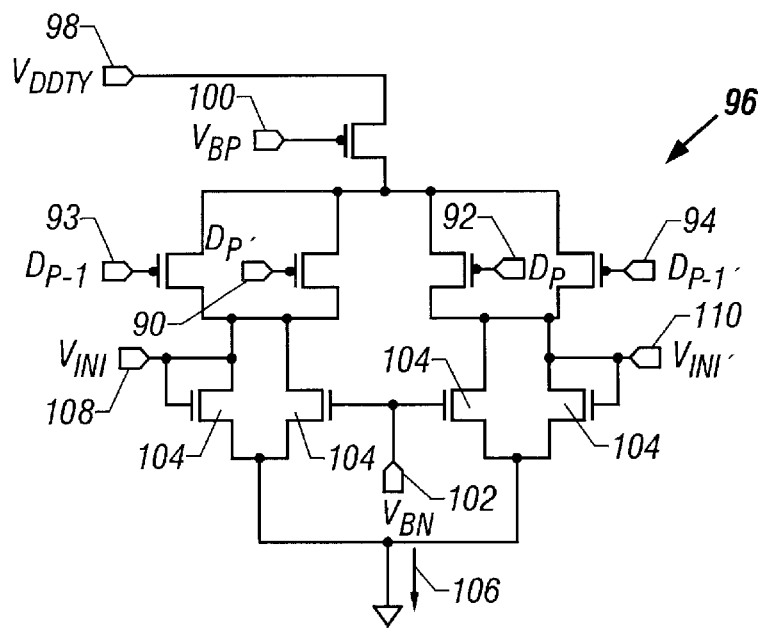
FIG. 9 shows a schematic of the predriver of a "P-channel" implementation of a pre-emphasis circuit.

FIGS. 8 and 9 show an embodiment of the present invention as a p-channel transmitter. The circuit is essentially the same as the n-channel transmitter except in the schematic of the predriver 96 shown in FIG. 9. The circuit is shown with two sets of two parallel "n-type" transistors 104, a transmitter supply voltage 98 ($V_{DDTX}$), an output voltage 108 ($V_{IN1}$) with its complement voltage 110 ($V_{IN1}$'), a p-channel bias voltage 100 ($V_{BP}$) provided to a "p-type" transistor, and an n-channel bias voltage 102 ($V_{BN}$) provided to two "n-type" transistors. The inputs for all of the data bits and their complements 90, 92, 93, and 94 are shown being provided to "n-type" transistors. This circuit will function as a D/A converter in the same manner as the previously described n-channel transmitter.

When compared with each other, the n-channel transmitter offers greater bandwidth because of less capacitance being used throughout the design. Also, the n-channel transmitter requires approximately half the area for the same amount of current. However, the p-channel transmitter has an advantage in that its termination voltage is the receiver ground. This is desirable for application specific integrated circuit (ASIC) implementations with different supply voltages since the absolute voltage specification would remain constant. Additionally, electrostatic device (ESD) circuit loading is better for a p-channel transmitter because the diodes have a greater reverse bias. In summary, if timing and budget limitations of a chip design limits the maximum transfer rate and this rate can be reached by a p-channel transmitter, then the p-channel driver may be more desirable embodiment.

Alternative embodiments could also include the use of twin termination. This involves terminating the transmission line at both ends by incorporating pull-up resistors 91a and 91b at the outputs of the transmitting side. These resistors will absorb any reflections from the receiving side. This will reduce the maximum DC signal amplitude by a factor of 2. However, it will increase the signal to noise ratio significantly and consequently reduce deterministic jitter. The net effect is that twin termination trades amplitude margin for timing margin. Twin termination is appropriate if the amplitude falls with the specification for an ASIC.

Table 1 shows the performance characteristics of several embodiments as compared to the prior art. The design constraints imposed a maximum possible bandwidth of 1.4 Gb/s. The power dissipation results were estimates reflected by a circuit simulator. The transmitter area was calculated by summing the area (width by length) that was used. A fudge factor of 4.5 was incorporated to cover any errors. Finally, the eye amplitude was measured at the end of a 30" line. The results for the present embodiments of the invention are based on data obtained from laboratory simulations.

TABLE 1

| OPTION | BANDWIDTH (Gb/s) | POWER DISSIPATION (mW) | TRANSMITTER AREA ($\mu m^2$) | EYE AMPLITUDE (mV) |
|---|---|---|---|---|
| N-Transmitter (Prior Art) | 1.05 | 13.5 | 333 | 225 |
| N Transmitter + Equalization (Prior Art) | 1.21 | 17 | 440 | 280 |
| N Transmitter + Twin Termination (Prior Art) | 1.15 | 14.3 | 533 | 150 |
| N Transmitter + Power/Area Efficient Equalization | 1.21 | 15 | 400 | 280 |
| P-Transmitter (Prior Art) | 1.05 | 12 | 774 | 210 |
| P Transmitter + Equalization (Prior Art) | 1.21 | 15 | 1015 | 225 |
| P Transmitter + Twin Termination (Prior Art) | 1.15 | 13 | 974 | 135 |
| P Transmitter + Power/Area Efficient Equalization | 1.15 | 13 | 850 | 225 |

The advantages of the disclosed invention may include the use of single driver stage for pre-emphasizing a high frequency signal. This allows for a reduction of power dissipation, a reduction in required area on the chip, and an increase in the bandwidth.

While the invention has been disclosed with reference to specific examples of embodiments, numerous variations and modifications are possible. Therefore, it is intended that the invention not be limited by the description in the specification, but rather the claims that follow.

What is claimed is:

1. A method for pre-emphasizing a digital signal comprising:

receiving a data bit as input for a first flip-flop circuit;

outputting the data bit and the complement of the data bit from the first flip-flop circuit;

receiving a previous data bit from the output of the first flip-flop circuit as input for a second flip-flop circuit;

outputting the previous data bit and the complement of the previous data bit from the second flip-flop circuit;

receiving the data bit, the complement of the data bit, the previous data bit, and the complement of the previous data bit as input for a predriver;

pre-emphasizing a transition in value between the data bit and the previous data bit with the predriver; and outputting an equalized digital signal from the predriver.

2. The method of claim 1 wherein the predriver is an n-channel predriver.

3. The method of claim 1 wherein the predriver is a p-channel predriver.

4. The method of claim 1, further comprising:

receiving the equalized digital signal in an output stage; and outputting the equalized digital signal to a signal interconnection.

5. The method of claim 4 wherein the signal interconnection is a transmitter.

6. The method of claim 5 wherein at least one pull up resistor connected to an output of the signal interconnection.

* * * * *